United States Patent
Han et al.

(10) Patent No.: US 12,261,579 B2
(45) Date of Patent: Mar. 25, 2025

(54) CONTINUOUS TIME LINEAR EQUALIZER

(71) Applicants: SK hynix Inc., Icheon (KR); Industry-University Cooperation Foundation Hanyang University, Seoul (KR)

(72) Inventors: Jae Duk Han, Seoul (KR); Eun Ji Song, Seoul (KR); Gi Jin Park, Seoul (KR); Jeong Kyoum Kim, Icheon (KR)

(73) Assignees: SK hynix, Icheon (KR); Industry-University Cooperation Foundation Hanyang University, Seoul (KR)

( * ) Notice: Subject to any disclaimer, the term of this patent is extended or adjusted under 35 U.S.C. 154(b) by 243 days.

(21) Appl. No.: 17/751,391

(22) Filed: May 23, 2022

(65) Prior Publication Data
US 2023/0170880 A1   Jun. 1, 2023

(30) Foreign Application Priority Data

Dec. 1, 2021   (KR) .................. 10-2021-0170049

(51) Int. Cl.
*H03H 11/04*   (2006.01)
*H03H 7/38*   (2006.01)

(52) U.S. Cl.
CPC .............. *H03H 11/04* (2013.01); *H03H 7/38* (2013.01)

(58) Field of Classification Search
CPC ......... H03H 11/04; H03H 7/38; H03H 7/0115
See application file for complete search history.

(56) References Cited

U.S. PATENT DOCUMENTS

| | | | |
|---|---|---|---|
| 9,401,706 B2 * | 7/2016 | Tirunagari | H03K 19/0175 |
| 9,602,314 B1 | 3/2017 | Chang | |
| 10,270,409 B1 | 4/2019 | Forey et al. | |
| 2019/0089323 A1 * | 3/2019 | Nosaka | H01Q 1/50 |
| 2019/0123551 A1 * | 4/2019 | Yuan | H02H 9/046 |
| 2023/0253990 A1 * | 8/2023 | Singh | H03F 3/72 |
| | | | 455/552.1 |

FOREIGN PATENT DOCUMENTS

KR   20230078003 A   *   6/2023   ........... H03H 7/1766

* cited by examiner

*Primary Examiner* — Daniel C Puentes

(57) ABSTRACT

Disclosed is a continuous time linear equalizer circuit having a higher bandwidth by a plurality of filters connected to different signal paths in a T-coil circuit.

19 Claims, 4 Drawing Sheets

CONTINUOUS TIME LINEAR EQUALIZER

CROSS-REFERENCE TO RELATED APPLICATION

This application claims priority under 35 U.S.C. § 119 to Korean Patent Application No. 10-2021-0170049 filed on Dec. 1, 2021, which is incorporated herein by reference in its entirety.

BACKGROUND

1. Field

Embodiments of the present disclosure relate to a continuous time linear equalizer circuit to have a higher bandwidth by coupling filters to different nodes of a T-coil circuit.

2. Discussion of the Related Art

Data transmission is one of important functions of an integrated circuit element. With the development of an integrated circuit technology, a data transmission speed has been gradually increased. Particularly, as a technology of transmitting data in a wired or wireless manner reaches a gigahertz (GHz) range, an integrated circuit that transmits or receives data needs to process data having a frequency in the gigahertz range.

When an input signal having a high frequency is input to a receiving end of an integrated circuit, impedance matching is required between the input signal and an input node, and becomes more necessary as a frequency of the input signal increases. When the impedance matching is properly performed at the receiving end, a bandwidth of the input signal is eventually reduced due to signal reflection at a termination end. For the receiving end of the integrated circuit, a T-coil circuit may be used as one of circuits for the impedance matching.

The input node of the integrated circuit also requires an anti-electrostatic circuit to prevent internal elements of the integrated circuit from being destroyed by static electricity. This is because a pin through which a signal is transmitted to the integrated circuit is exposed to the outside and is likely to be exposed to the static electricity. When the internal elements of the integrated circuit are destroyed by the static electricity, it may cause irreparable damage to the integrated circuit. In most anti-electrostatic circuits, diodes, resistors, capacitors, and/or the like connected in a reverse direction are arranged in an appropriate combination. Meanwhile, an impedance component of an anti-electrostatic circuit may also affect impedance matching occasionally.

For the receiving end of the integrated circuit that receives signals input at high speed, a continuous signal linear equalizer circuit capable of properly tracking input signals is also used. As described above, a bandwidth of the continuous signal linear equalizer circuit is reduced by an anti-electrostatic circuit, a T-coil circuit, and the like, and thus a severe problem may occur when the signals are input to the continuous signal linear equalizer circuit at high speed. Therefore, there is a need for a continuous signal linear equalizer circuit having a higher bandwidth.

SUMMARY

An objective of the present disclosure is to increase a bandwidth of a continuous signal linear equalizer circuit using a T-coil circuit.

Another objective of the present disclosure is to provide a receiving end circuit capable of receiving signals at a high speed without reducing the magnitude or bandwidth of the signals.

Still another objective of the present disclosure is to allow a semiconductor chip to use the present disclosure or an electronic circuit system to use the semiconductor chip in order to provide higher-speed signal processing.

In order to solve the above problems, a continuous signal linear equalizer using a T-coil in accordance with an embodiment of the present disclosure may include: a T-coil circuit including a capacitive load connected to one path of parallel-connected paths and at least two inductive loads connected to the other path; a first filter coupled to the one path; a second filter coupled to the other path; and a coupling unit configured to couple an output of the first filter and an output of the second filter to each other.

In order to solve the above problems, a continuous signal linear equalizer using a T-coil in accordance with another embodiment of the present disclosure may include: at least two T-coil circuits each including a capacitive load connected to one path of parallel-connected paths and at least two inductive loads connected to the other path; a first filter having one input connected to an output of a first T-coil circuit included in the T-coil circuits and connected to the one path and another input connected to an output of a second T-coil circuit included in the T-coil circuits and connected to the other path; a second filter having one input connected between the two inductive loads of the first T-coil circuit and another input connected between the two inductive loads of the second T-coil circuit; and a coupling unit configured to couple an output of the first filter and an output of the second filter.

The present disclosure can increase a bandwidth of a receiving end circuit that receives signals serially input at high speed.

Furthermore, a semiconductor chip adopting the receiving end circuit can also provide higher-speed signal processing.

Furthermore, when an electronic circuit including the present disclosure or a system thereof processes higher-speed signals, signal attenuation can be minimized and a bandwidth can be increased.

DETAILED DESCRIPTION

Figure 1:
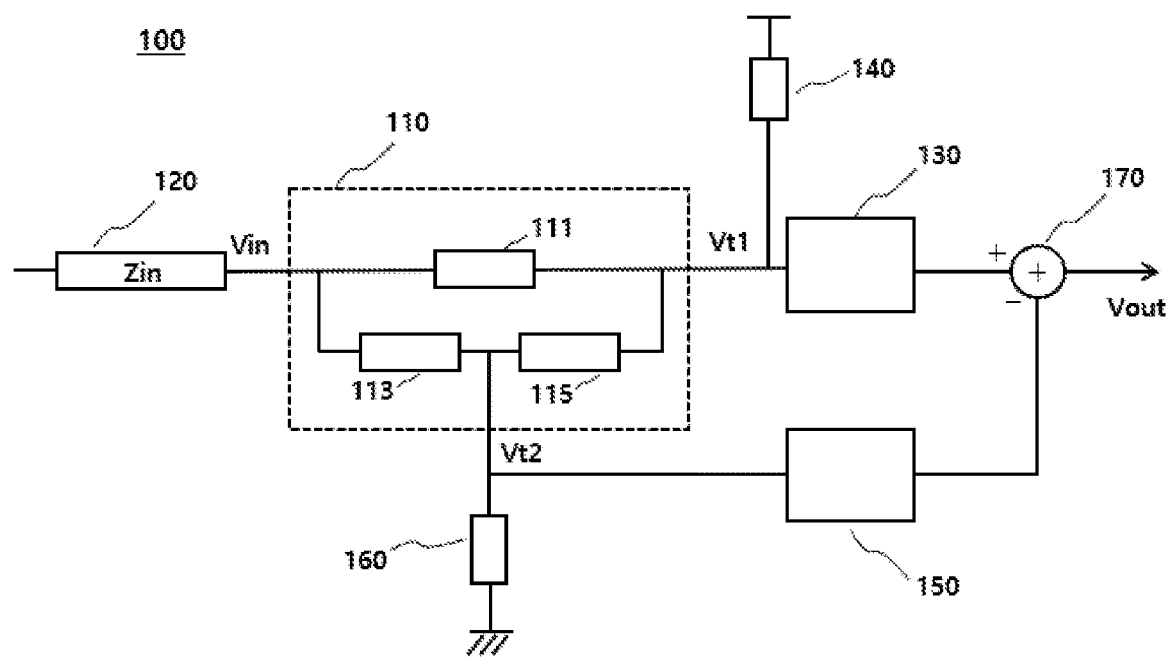
FIG. 1 illustrates a continuous time linear equalizer in accordance with an embodiment of the present disclosure.

Hereinafter, embodiments of the present disclosure will be described in detail with reference to the accompanying drawings so that a person skilled in the art to which the present disclosure pertains can easily carry out the present disclosure. The same reference numerals among the reference numerals in each drawing indicate the same members.

In the description of the present disclosure, when it is determined that detailed descriptions of related publiclyknown technologies may obscure the subject matter of the present disclosure, the detailed descriptions thereof will be omitted.

The terms such as 'first' and 'second' may be used to describe various components, but the components are not limited by the terms, and the terms are used only to distinguish one component from another component.

FIG. 1 illustrates a continuous time linear equalizer (CTLE) 100 in accordance with an embodiment of the present disclosure. The continuous time linear equalizer 100 is one of circuits receiving signals at high speed.

Referring to FIG. 1, the continuous time linear equalizer 100 includes a T-coil circuit 110, a first filter 130, a second filter 150, and a coupling unit 170. The continuous time linear equalizer 100 may further include an anti-electrostatic element 160 for preventing static electricity, and an element 140 for impedance matching as needed.

Particularly, since an input pin or the like, which is a passage for connecting an integrated circuit to the outside, is exposed to static electricity, a gate oxide film of a transistor included in the integrated circuit may be destroyed.

In order to prevent such a problem, the anti-electro static element 160 is used, and elements such as resistors, capacitors, or diodes are used alone or in an appropriate combination thereof. Therefore, signal transmission in the integrated circuit may be delayed due to a capacitive load of the anti-electro static element 160, which is disadvantageous for a high-speed operation. The capacitive load includes parasitic capacitance inside the anti-electro static element 160, capacitance of a capacitor arranged as a passive element in the anti-electro static element 160, and the like.

A voltage at an input node of the continuous time linear equalizer 100 is indicated by Vin and a voltage at an output node thereof is indicated by Vout. An element 120 connected to the input node is for representing the equivalent impedance Zin of an input terminal of the continuous time linear equalizer 100, and it is apparent to those who understand microwaves. The element 120 may not refer to a specific active element or passive element. As a frequency of a signal increases, a transmission line effect may appear in a channel on an input side to which the signal is transmitted, and thus the transmission line effect may be indicated by the impedance Zin (also indicated by reference numeral 120) of the channel.

The impedance Zin of the channel may be referred to as characteristic impedance that is indicated by a combination of a resistor and a capacitance, and the characteristic impedance may have characteristics of a low-pass filter due to such characteristics since high-frequency components of a signal are attenuated. This is well known to engineers who deal with high-frequency signals.

The first filter 130 and the second filter 150 may be low-pass filters and have different bandwidths (BW), and the coupling unit 170 performs an addition or subtraction operation on output signals of the first filter 130 and the second filter 150. In an embodiment, the first filter 130 and the second filter 150 each may be implemented with a MOS transistor and a capacitive load.

The T-coil circuit 110 is located at a front end of the continuous time linear equalizer 100 to receive the input voltage Vin. The received input voltage Vin may be a continuous signal of serial data operating at high speed. The T-coil circuit 110 provides outputs Vt1 and Vt2 by passing the continuous signal Vin through two or more different paths inside the T-coil circuit 110.

The T-coil circuit 110 includes elements 111, 113, and 115 that are configured as passive elements and active elements as needed. The first element 111 is connected in parallel with the second and the third elements 113 and 115. The second and the third elements 113 and 115 are connected in series, and a signal transmission path is branched between them.

Figure 2:
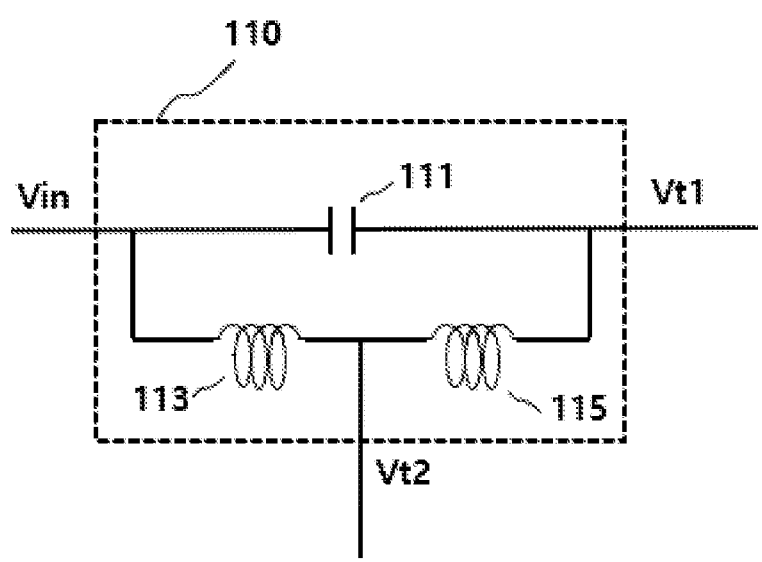
FIG. 2 illustrates a T-coil circuit in accordance with an embodiment of the present disclosure.

FIG. 2 illustrates the T-coil circuit 110 of FIG. 1 in accordance with an embodiment. FIG. 2 illustrates configuring two signal paths by combining a capacitive load and inductive loads. However, embodiments are not limited thereto. Other embodiments can be configured by variously combining capacitive loads and inductive loads in various methods.

Referring to FIG. 2, the T-coil circuit 110 includes a capacitive load 111 and first and second inductive loads 113 and 115. The capacitive load 111 is connected in parallel with the first and the second inductive loads 113 and 115. The first and the second inductive loads 113 and 115 are connected in series, and a signal transmission path is branched between them.

Referring back to FIG. 1, the first filter 130 and the second filter 150 existing in different signal paths have different bandwidths, which may be changed to a desired bandwidth by the function of the coupling unit 170. Such characteristics of the present disclosure are obtained as the total capacitance on the input side is divided into different paths by the first and second filters 130 and 150. More specifically, the characteristics occur because the capacitance on the input side acting as a pole of a transfer function is effectively halved.

Figure 3:
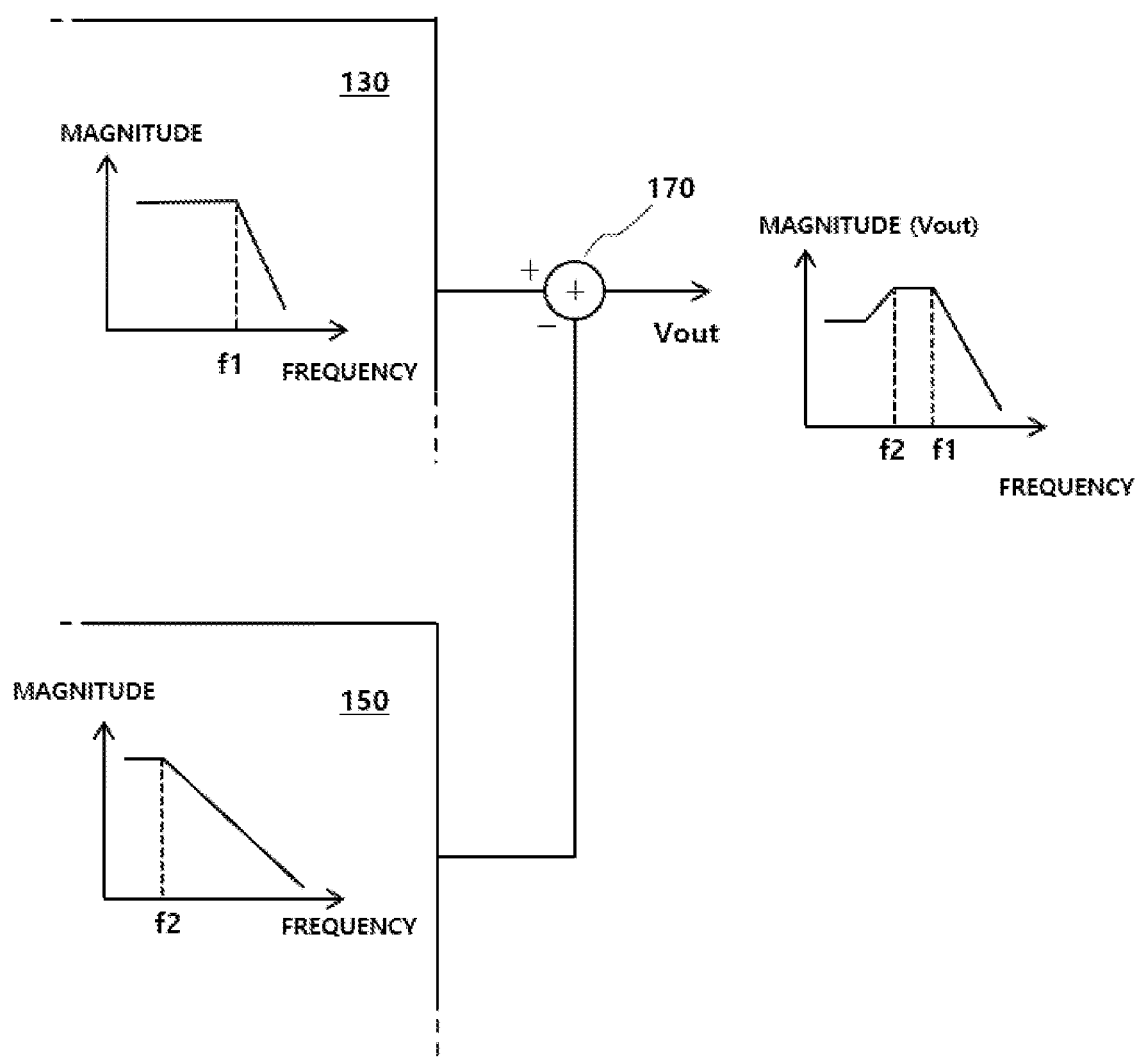
FIG. 3 schematically illustrates a bandwidth increase effect in accordance with an embodiment of the present disclosure.

FIG. 3 illustrates frequency characteristics of the first filter 130 and the second filter 150 of FIG. 1 in accordance with an embodiment. In FIG. 3, a vertical axis denotes the magnitude of a signal and a horizontal axis denotes a frequency of the signal. When the bandwidth of the first filter 130 is indicated by f1 and the bandwidth of the second filter 150 is indicated by f2 (f1>f2). In FIG. 3, the vertical axis may denote a decibel (dB) and the horizontal axis may denote a log scale. The bandwidth of the output signal Vout of the continuous time linear equalizer 100 increases due to the addition or subtraction operation of the coupling unit 170. The bandwidth (BW) may be slightly different depending on the definition thereof, but it is usually based on a value at which the magnitude of the signal decreases by about 3 dB from the midband, and the same applies to the present disclosure.

In FIG. 1, the first filter 130 having a higher cutoff frequency between the first and the second filters 130 and 150 is connected to one output node Vt1 of the T-coil circuit 110 that is connected to one terminal of the capacitive load 111, and the second filter 150 having a lower cutoff frequency is connected to another output node Vt2 of the T-coil circuit 110 that is a connection node of the first and the second inductive loads 113 and 115 serially connected to each other. When such a connection configuration in FIG. 1 is differently expressed, the first filter 130 having the higher cutoff frequency is connected to the impedance matching element 140, and the second filter 150 having the lower cutoff frequency is connected to the anti-electrostatic element 160. In accordance with such an embodiment, it is possible to reduce a gain attenuation phenomenon that becomes severe as the frequency of the signal increases due to the pole effect of the frequency characteristics of the T-coil circuit 110 or the first and the second filters 130 and 150.

Figure 4:
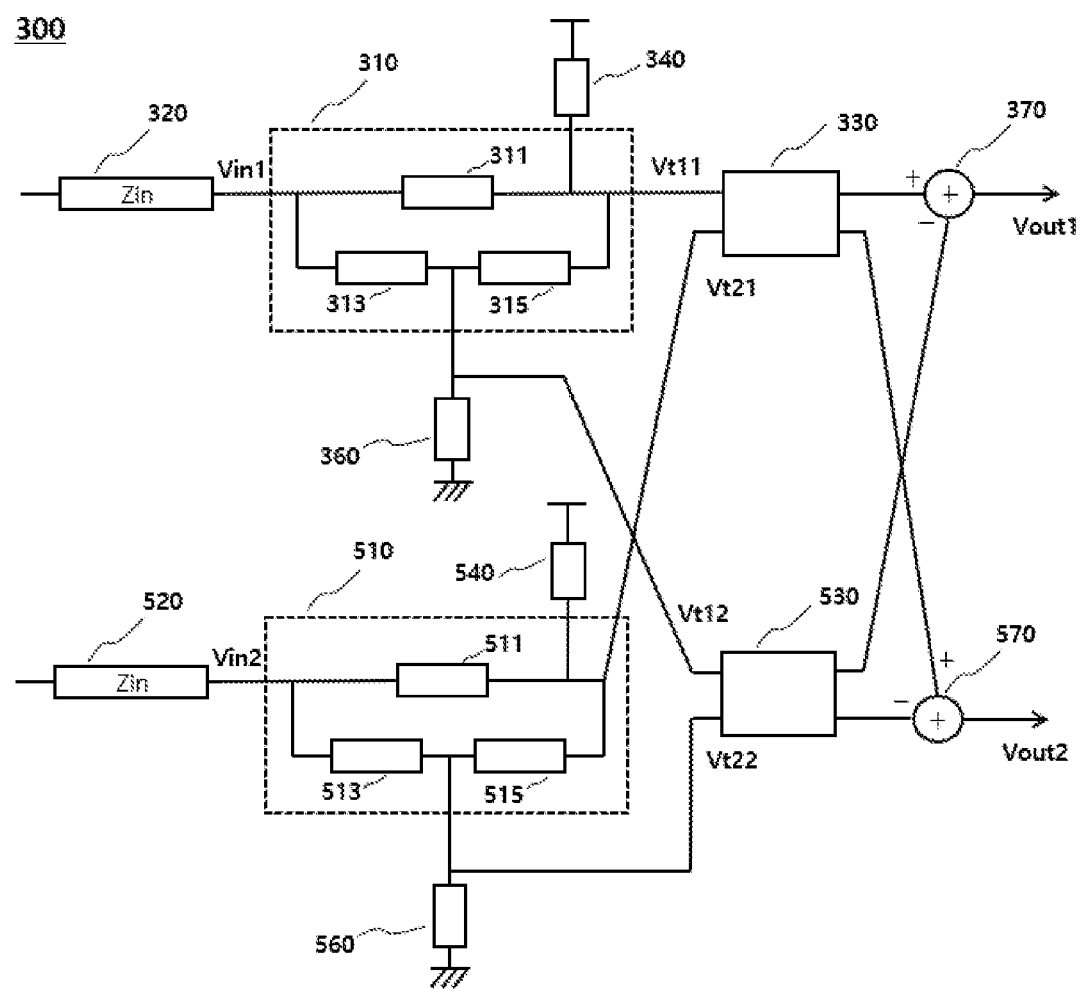
FIG. 4 illustrates a continuous time linear equalizer in accordance with another embodiment of the present disclosure.

FIG. 4 illustrates a continuous time linear equalizer 300 in accordance with another embodiment of the present disclosure. The continuous time linear equalizer 300 processes differential inputs Vin1 and Vin2 and outputs differential outputs Vout1 and Vout2.

Referring to FIG. 4, each of first and second filters 330 and 530 may be configured to have differential inputs and differential outputs, and first and second T-coil circuits 310 and 510 are provided. First and second elements 320 and 520 respectively connected to the differential inputs Vin1 and Vin2 indicate equivalent impedance of reception channels of input terminals of the continuous time linear equalizer 300. First and second impedance matching elements 340 and 540 are connected to the first and second T-coil circuits 310 and 510, respectively. First and second anti-electrostatic elements 360 and 560 are connected to the first and second T-coil circuits 310 and 510, respectively.

The first and the second T-coil circuits 310 and 510 have output signals of different paths. Output nodes Vt11 and Vt12 of the first T-coil circuit 310 are connected to ones of differential input terminals of the first and the second filters 330 and 530, respectively. Output nodes Vt21 and Vt22 of the second T-coil circuit 510 are connected to the other ones of the differential input terminals of the first and the second filters 330 and 530, respectively.

One of the differential outputs of each of the first and the second filters 330 and 530 is input to a first coupling unit 370 and is subjected to an addition or subtraction operation of the first coupling unit 370, and a result value of the addition or subtraction operation is provided as a first output Vout1. The other one of the differential outputs of each of the first and the second filters 330 and 530 is input to a second coupling unit 570 and is subjected to an addition or subtraction operation of the second coupling unit 570, and a result value of the addition or subtraction operation is provided as a second output Vout2.

Similar to the embodiment described above with reference to FIGS. 1 to 3, the first filter 330 and the second filter 530 may be low-pass filters and have different bandwidths. The first filter 330 may have a higher cutoff frequency than the second filter 530. In an embodiment, the first filter 330 and the second filter 530 each may be implemented with a MOS transistor and a capacitive load.

Even in the above operation of the continuous time linear equalizer 300 with respect to the differential inputs Vin1 and Vint, a bandwidth increase phenomenon occurs due to an operation principle similar to that in the embodiment described above with reference to FIGS. 1 to 3. This can be easily seen that an effect similar to that illustrated in FIG. 3 is obtained when transfer functions are obtained for the circuit of the present disclosure including a channel, and this can be intuitively understood by designers of the circuit. For example, when a transfer function of a channel is H1(s) and a transfer function of a T-coil circuit and filters is H2(s), the overall transfer function in a frequency domain is expressed as a product of H1(s) and H2(s), i.e., H1(s)*H2(s). In such a case, the present disclosure acquires the overall bandwidth improvement effect including the channel due to the bandwidth improvement effect of H2(s).

The embodiments of the present disclosure can implement a continuous time linear equalizer having a higher bandwidth. Particularly, it is preferable to apply the embodiments of the present disclosure when an integrated circuit having a serial interface, an electronic circuit system, and the like need to receive higher-speed signals.

Although preferred embodiments of the present disclosure have been described in detail, the scope of the present disclosure is not limited thereto, and the present disclosure may be implemented as various embodiments based on the basic concept of the present disclosure defined in the following claims. Such embodiments also fall within the scope of the present disclosure.

What is claimed is:

1. A continuous time linear equalizer, comprising:
    a T-coil circuit including a capacitive load connected to one path of parallel-connected paths and at least two serially connected inductive loads connected to the other path of the parallel-connected paths;
    an input of a first filter connected to the one path;
    an input of a second filter connected between the two serially connected inductive loads; and
    a coupling unit configured to couple an output of the first filter and an output of the second filter to each other.

2. The continuous time linear equalizer according to claim 1, wherein an anti-electrostatic element is connected between the two serially connected inductive loads.

3. The continuous time linear equalizer according to claim 1, wherein the first filter and the second filter are low-pass filters.

4. The continuous time linear equalizer according to claim 1, wherein the first filter and the second filter have different bandwidths.

5. The continuous time linear equalizer according to claim 1, wherein a load for impedance matching is connected to the T-coil circuit.

6. The continuous time linear equalizer according to claim 1, wherein the coupling unit performs an addition or subtraction operation on the output of the first filter and the output of the second filter.

7. The continuous time linear equalizer according to claim 1, wherein at least one of the first filter or the second filter includes a MOS transistor and a capacitive load.

8. A continuous time linear equalizer, comprising:
    at least two T-coil circuits each including a capacitive load connected to one path of parallel-connected paths and at least two serially connected inductive loads connected to the other path of the parallel-connected paths;
    a first filter having one input connected to an output of a first T-coil circuit of the at least two T-coil circuits and another input connected to an output of a second T-coil circuit of the at least two T-coil circuits;
    a second filter having one input connected between the two serially connected inductive loads of the first T-coil circuit and another input connected between the two serially connected inductive loads of the second T-coil circuit; and
    a coupling unit configured to couple an output of the first filter and an output of the second filter.

9. The continuous time linear equalizer according to claim 8, wherein an anti-electrostatic element is connected between the two serially connected inductive loads of each of the at least two T-coil circuits.

10. The continuous time linear equalizer according to claim 8, wherein the first filter and the second filter are low-pass filters.

11. The continuous time linear equalizer according to claim 8, wherein the first filter and the second filter have different bandwidths.

12. The continuous time linear equalizer according to claim 8, wherein a load for impedance matching is connected to each of the T-coil circuits.

13. The continuous time linear equalizer according to claim 8, wherein the first filter and the second filter each have differential inputs and differential outputs.

14. The continuous time linear equalizer according to claim 8, wherein the coupling unit performs an addition or subtracting operation on the output of the first filter and the output of the second filter.

15. The continuous time linear equalizer according to claim 13, wherein the coupling unit performs an addition or subtraction operation on a positive (+) output of the differential outputs of the first filter and a positive (+) output of the differential outputs of the second filter.

16. The continuous time linear equalizer according to claim 8, wherein at least one of the first filter or the second filter includes a MOS transistor and a capacitive load.

17. The continuous time linear equalizer according to claim 8, wherein the coupling unit includes at least one adder.

18. The continuous time linear equalizer according to claim 8, wherein a load for impedance matching is connected to the one path of the parallel-connected paths of each of the at least two T-coil circuits.

19. The continuous time linear equalizer according to claim 11, wherein the bandwidth of the first filter is greater than that of the second filter.

\* \* \* \* \*